United States Patent
Mimura et al.

(10) Patent No.: US 7,022,616 B2
(45) Date of Patent: Apr. 4, 2006

(54) HIGH SPEED SILICON ETCHING METHOD

(75) Inventors: Takanori Mimura, Nirasaki (JP);
Kazuya Nagaseki, Nirasaki (JP);
Itsuko Sakai, Yokohama (JP);
Tokuhisa Ohiwa, Kawasaki (JP)

(73) Assignees: Tokyo Electron Limited, Tokyo (JP);
Kabushiki Kaisha Toshiba, Tokyo (JP)

( * ) Notice: Subject to any disclaimer, the term of this patent is extended or adjusted under 35 U.S.C. 154(b) by 237 days.

(21) Appl. No.: 10/380,428

(22) PCT Filed: Sep. 13, 2001

(86) PCT No.: PCT/JP01/07962

§ 371 (c)(1),
(2), (4) Date: Mar. 14, 2003

(87) PCT Pub. No.: WO02/23609

PCT Pub. Date: Mar. 21, 2002

(65) Prior Publication Data

US 2004/0097079 A1    May 20, 2004

(51) Int. Cl.
*H01L 21/302* (2006.01)
(52) U.S. Cl. ............... 438/714; 438/706; 438/710; 156/345.35
(58) Field of Classification Search ............... 438/637, 438/706, 710, 712, 714; 216/59, 67, 58; 156/345.35, 345.4, 345.41, 345.42
See application file for complete search history.

(56) References Cited

U.S. PATENT DOCUMENTS

| 4,863,833 | A | * | 9/1989 | Fukuyama et al. ...... 430/286.1 |
| 5,536,364 | A |   | 7/1996 | Yoshida et al. |
| 6,287,978 | B1 | * | 9/2001 | Becker et al. ............. 438/723 |
| 6,291,357 | B1 | * | 9/2001 | Zhang et al. ............. 438/714 |
| 6,318,384 | B1 | * | 11/2001 | Khan et al. ............. 134/22.1 |
| 6,518,195 | B1 | * | 2/2003 | Collins et al. ............. 438/723 |
| 6,593,244 | B1 | * | 7/2003 | Wang et al. ............. 438/706 |

FOREIGN PATENT DOCUMENTS

| EP | 472941 | 3/1992 |
| EP | 665575 | 8/1995 |
| JP | 5-102107 | 4/1993 |
| JP | 05-129248 | 5/1993 |
| JP | 08-64585 | 3/1996 |
| JP | 11-297672 | 10/1999 |

* cited by examiner

*Primary Examiner*—Lan Vinh
(74) *Attorney, Agent, or Firm*—Oblon, Spivak, McClelland, Maier & Neustadt, P.C.

(57) ABSTRACT

This invention provides the following high-rate silicon etching method. An object to be processed W having a silicon region is so set as to be in contact with a process space in a process chamber that can be held in vacuum. An etching gas is introduced into the process space to form a gas atmosphere at a gas pressure of 13 Pa to 1,333 Pa (100 mTorr to 10 Torr). A plasma is generated upon application of RF power. In the plasma, the sum of the number of charged particles such as ions and the number of radicals increases, and etching of the silicon region is performed at a higher rate than in conventional etching.

18 Claims, 5 Drawing Sheets

HIGH SPEED SILICON ETCHING METHOD

TECHNICAL FIELD

The present invention relates to a high-rate silicon etching method of etching a silicon (Si) region of an object to be processed such as a single-crystal silicon substrate at high rate.

BACKGROUND ART

Recently, a three-dimensional package device having a multilayered device structure has been developed. This three-dimensional package device is obtained by stacking silicon substrates or the like having, e.g., circuit elements and memory elements, in multiple levels to form a multilayered substrate, and connecting the layers with through hole interconnections. This structure realizes a compact device having a high space efficiency.

In this three-dimensional package device, interconnection through holes each with a diameter of about 10 µm to 70 µm must be formed in silicon substrates each with a thickness of about 100 µm. Hence, very high-rate etching is required.

High-rate silicon etching can be applied not only to such a three-dimensional package device but also to machining of the order of submicrons in various types of micromachining, and can be utilized to form not only through holes but also, e.g., groove shapes.

For the high-rate etching, an induction coupling type plasma etching apparatus which can realize a high plasma density is conventionally used.

However, even in high-rate etching using the conventional induction coupling type plasma etching apparatus, the etching rate is about 10 µm/min at maximum, and a sufficiently high rate is not always obtained.

DISCLOSURE OF INVENTION

It is an object of the present invention to provide a high-rate silicon etching method that can realize a high etching rate than that of a conventional method.

In order to achieve the above object, according to the present invention, there is provided a high-rate silicon etching method of setting an object to be processed having a silicon region so as to be in contact with a process space in a process chamber that can be held in vacuum, forming in the process space a gas atmosphere into which an etching gas has been introduced, generating a plasma upon application of RF power, and etching the silicon region of the object to be processed in the plasma at high rate, wherein the gas pressure in the process space while the plasma is being generated is set to 13 Pa to 1,333 Pa (100 mTorr to 10 Torr).

According to the present invention, an object to be processed W having a silicon region is set to be in contact with the process space in the process chamber. An etching gas is introduced into the process space to form a gas atmosphere with a gas pressure of 13 Pa to 1,333 Pa (100 mTorr to 10 Torr). Furthermore, RF power is applied to generate a plasma. In the plasma, the sum of the number of charged particles such as ions and the number of radicals increases, so etching of the silicon region can be performed at a higher rate than in conventional etching.

BEST MODE FOR CARRYING OUT THE INVENTION

The idea of a high-rate silicon (Si) etching method according to the present invention will first be described.

Conventionally, since a high plasma density was necessary for high-rate silicon etching, silicon etching was performed under a high plasma density by using an induction coupling type plasma etching processing apparatus. This aimed at increasing the plasma density, i.e., the ionization rate, so as to increase the number of ions per unit volume.

Figure 4:
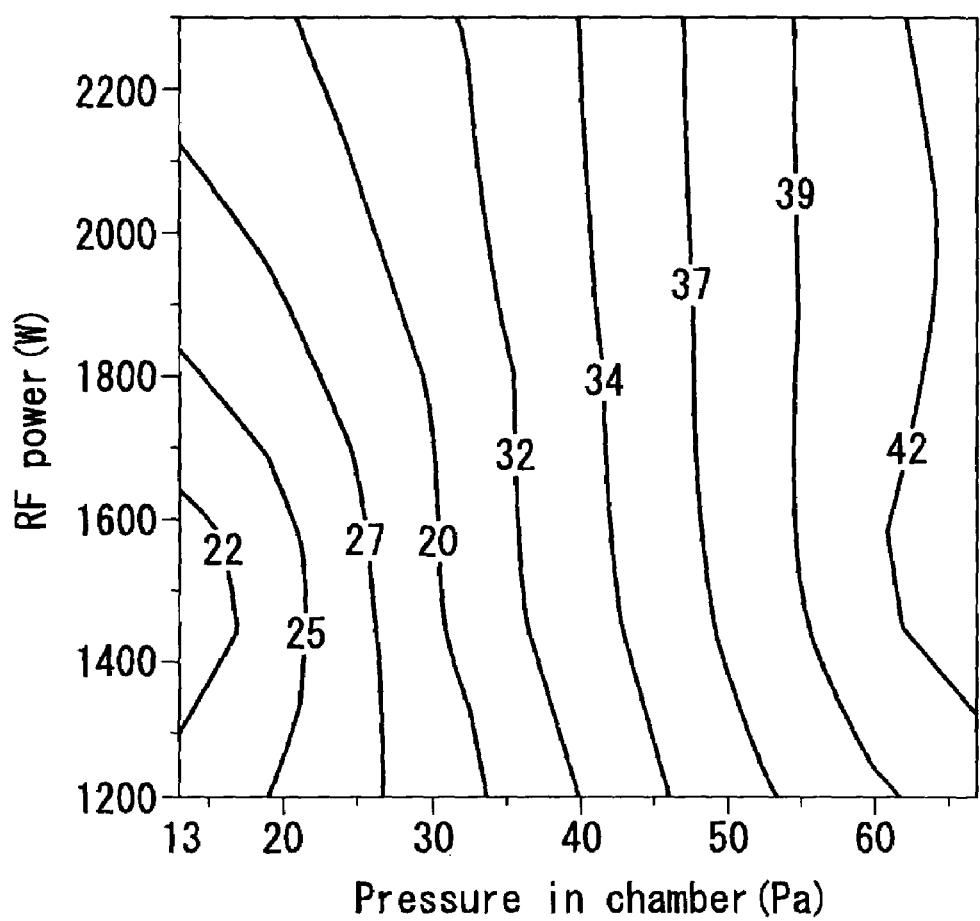
FIG. 4 is a graph showing the relationship between the pressure in the process chamber, the RF power, and the etching rate.

This silicon etching was examined, and the following fact was found. In order to increase the silicon etching rate, it was more effective to increase the gas pressure in the process chamber than to increase the plasma density, as shown in FIG. 4 (to be described later). More specifically, radicals as neutral particles largely contributed to silicon etching. To increase the etching rate, the sum of the number of charged particles such as ions and the number of radicals must be large. To satisfy this, the gas pressure in the process chamber, more particularly, in the process space with which the object to be processed (target etching surface) is in contact must be increased.

The present invention has been made on the basis of this finding, and provides a high-rate silicon etching method of holding an object to be processed having a silicon region to be in contact with a process space in a process chamber that can be held in vacuum, causing (generating) a plasma in an atmosphere into which a process gas has been introduced, and etching this silicon region at high rate.

Figure 1:
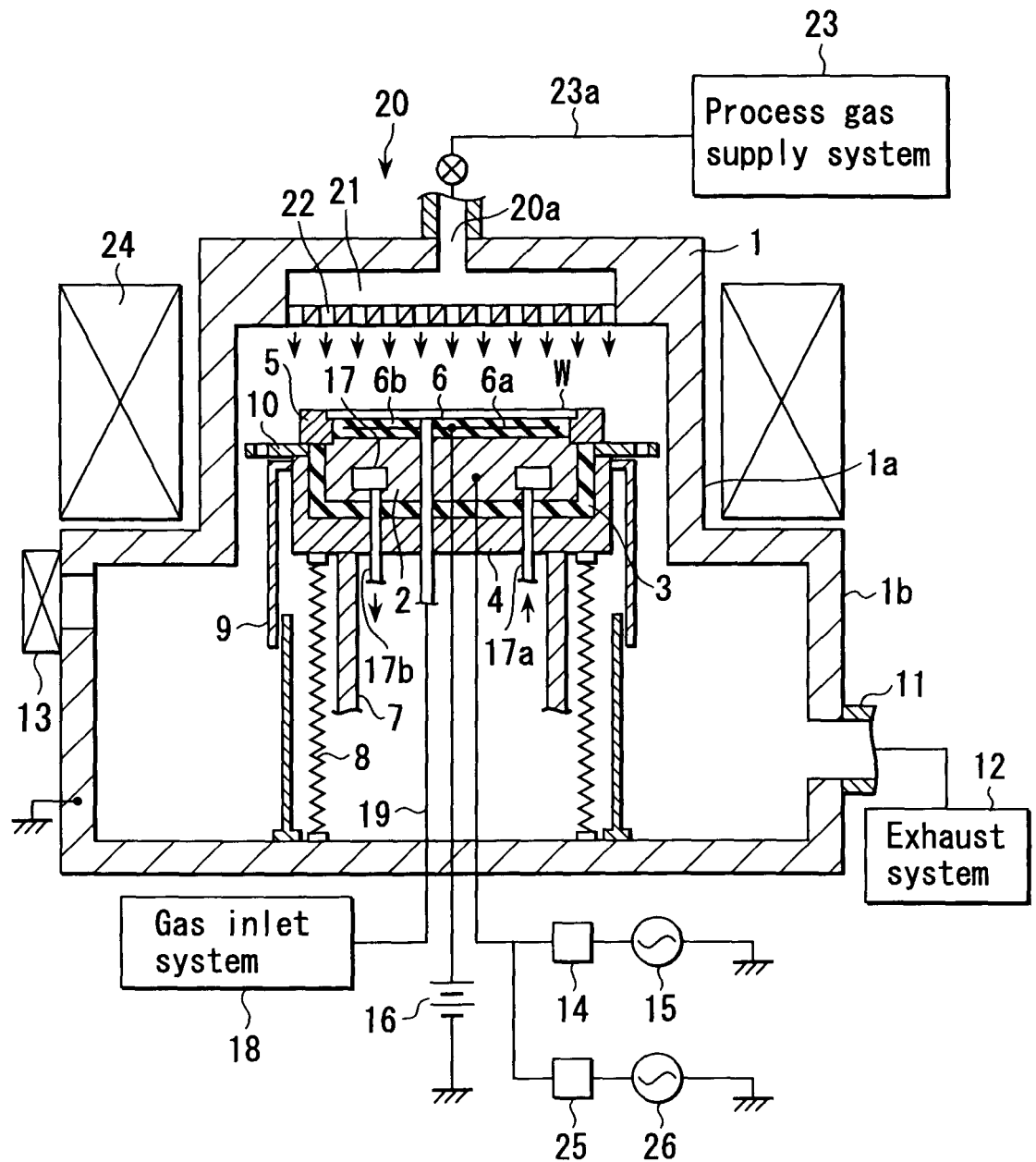
FIG. 1 is a view showing an arrangement of a magnetron RIE plasma etching apparatus for realizing a high-rate silicon etching method according to the present invention.

FIG. 1 is a view showing the schematic arrangement of a magnetron RIE (Reactive Ion Etching) plasma etching apparatus (to be referred to as an etching apparatus hereinafter) used for realizing a high-rate silicon etching method according to an embodiment of the present invention.

This etching apparatus has a stepped cylindrical process chamber 1 formed of two cylinders with different diameters that are connected to each other. In this process chamber 1, a small-diameter upper chamber 1a and a lower chamber 1b with a diameter larger than that of the upper chamber 1a, both of which are made of aluminum, can be held in the vacuum state, and are grounded at the GND potential. The process chamber is not limited to an aluminum one, but can be made of another conductor such as stainless steel.

A susceptor for horizontally holding a silicon wafer W as the object to be processed is formed in the process chamber 1. For example, the susceptor is formed by fitting a support table 2 made of aluminum in a support base 4 made of a conductor through an insulating plate 3.

RF powers from two systems are supplied to the support table 2. The support table 2 is connected to a plasma-generating first RF power supply 15 through a matching unit 14. The RF power supply 15 supplies RF power with a predetermined frequency to the support table 2. Similarly, the support table 2 is also connected to a second RF power supply 26. The RF power supply 26 supplies RF power with a frequency lower than that of the first RF power supply 15 to the support table 2 through a matching unit 25, so as to be superimposed on the plasma-generating RF power described above. The frequencies of the RF powers are not limited, but are appropriately selected in accordance with etching process.

A focus ring 5 made of a material other than silicon, e.g., quartz, is formed on the periphery of the support table 2. An electrostatic chuck 6 for electrostatically chucking and holding the silicon wafer W is formed inside the focus ring 5 and on the table surface.

The electrostatic chuck 6 is formed by incorporating an electrode 6a in an insulator 6b. The electrode 6a is connected to a DC power supply 16. When the DC power supply 16 applies a voltage to the electrode 6a, an electrostatic force, e.g., the Coulomb force, is generated to attract the silicon wafer W. The support table 2 also has a refrigerant area 17. A refrigerant from a cooling unit (not shown) is introduced to the refrigerant area 17 through a refrigerant inlet pipe 17a. The refrigerant is circulated in the refrigerant area 17 such that it is discharged through a refrigerant discharge pipe 17b. The cooling heat of the refrigerant is transferred to the silicon wafer W from the lower side through the support table 2. Thus, the wafer process surface is controlled at a desired temperature.

When the interior of the process chamber 1 is set in the vacuum state, the cooling heat of the refrigerant cannot be transferred to the silicon wafer W easily. Therefore, a heat transfer gas for transferring the cooling heat is introduced by a gas inlet system 18 to a space between the upper surface of the electrostatic chuck 6 and the lower surface of the silicon wafer W through a gas supply line 19. The cooling efficiency is thus increased.

Furthermore, a baffle plate 10 is formed under the periphery of the focus ring 5. The support table 2 and support base 4 can be vertically moved by a ball screw mechanism including ball screws 7. The driving portion of the ball screw mechanism which is below the support base 4 is covered by a bellows 8 made of stainless steel (SUS). This bellows 8 separates the process chamber which is to be set in the vacuum state from the ball screw mechanism which is to be set in the atmospheric state. A bellows cover 9 is formed outside the bellows 8. The focus ring 5 is electrically connected to the process chamber 1 through the baffle plate 10, support base 4, and bellows 8, and is set at the GND potential.

An exhaust port 11 is formed in the side wall of the lower chamber 1b, and the exhaust port 11 is connected to an exhaust system 12. The vacuum pump (not shown) of the exhaust system 12 is actuated to reduce the pressure in the process chamber 1 to a predetermined vacuum degree. An outlet/inlet port for loading/unloading the silicon wafer W is formed in the upper portion of the side wall of the lower chamber 1b. A gate valve 13 for opening/closing this opening portion from the outside is provided.

A shower head 20 is formed in the ceiling wall portion in the process chamber 1. A large number of gas discharge holes 22 are formed in the lower surface of the shower head 20, to be parallel to the silicon wafer W held by the support table 2. The shower head 20 is set at the same GND potential as the process chamber 1. The shower head 20 has a diffusion space 21 between its lower surface and a gas inlet portion 20a formed at its upper portion (the ceiling portion in the process chamber 1). The introduced gas diffuses in the diffusion space 21.

The gas inlet portion 20a is connected to a gas supply pipe 23a. The other end of the gas supply pipe 23a is connected to a process gas supply system 23. The process gas supply system 23 supplies a process gas containing an etching gas and diluent gas. The process gas supply system 23 is constituted by gas sources (not shown) for the etching gas and the like, and mass flow controllers (not shown) and valves (not shown). The mass flow controllers and valves are respectively connected midway along pipes from the gas sources.

The etching gas flows via the gas supply pipe 23a and gas inlet portion 20a to reach the diffusion space 21 in the shower head 20. The etching gas is then discharged from the gas discharge holes 22 into the process chamber 1 to form an etching gas atmosphere in the process space.

With this arrangement, the opposing shower head 20 and support table 2 serve as the upper electrode and lower electrode to form the etching gas atmosphere in the process space between them. When the RF power supply 15 applies RF power to the support table 2 serving as the lower electrode, a plasma is generated.

Figure 2:
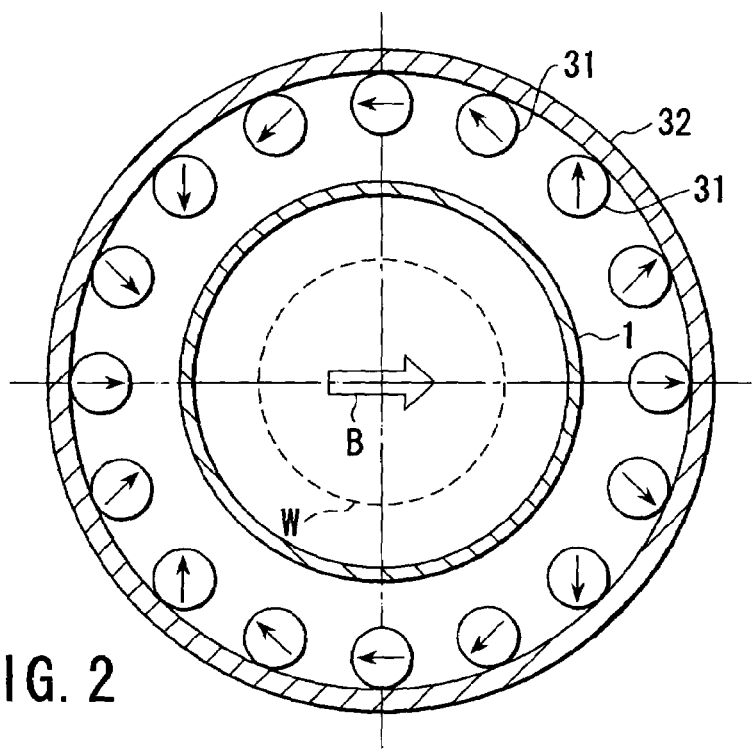
FIG. 2 is a view schematically showing a dipole ring magnet arranged around a process chamber in the etching apparatus shown in FIG. 1.

A ring-shaped dipole ring magnet 24 is arranged around the upper chamber 1a. As shown in the horizontal sectional view of FIG. 2, the dipole ring magnet 24 is comprised by attaching a plurality of anisotropic segment columnar magnets 31 to a casing 32 formed of a ring-like magnetic body. In this example, 16 anisotropic segment columnar magnets 31 which form columns are arranged in the ring-like shape. In FIG. 2, arrows shown in the anisotropic segment columnar magnets 31 indicate the directions of magnetic fluxes. The directions of the magnetic fluxes of the plurality of anisotropic segment columnar magnets 31 are slightly shifted from each other to form a uniform horizontal field B, directed in one direction, as a whole.

Figure 3:
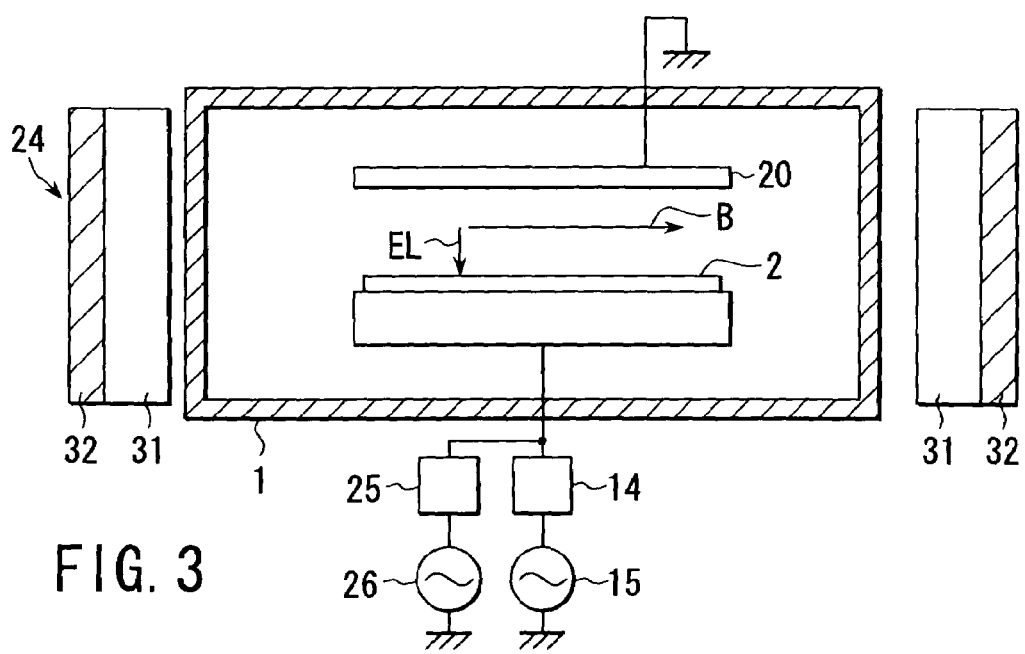
FIG. 3 is a view for explaining an electric field and magnetic field formed in the process chamber.

Therefore, as schematically shown in FIG. 3, in the space between the support table 2 and shower head 20, upon application of the RF power from the RF power supply 15, an electric field EL in the vertical direction along the upper and lower electrodes is formed. Also, the horizontal field B parallel to the direction along the upper and lower electrodes is formed by the dipole ring magnet 24. A plasma (magnetron discharge) is generated in the orthogonal electromagnetic fields formed in this manner. The plasma is generated in the high-energy etching gas atmosphere in this manner, and etches the silicon wafer W.

The high-rate silicon etching method using the etching apparatus with the above arrangement will be described.

First, the gate valve 13 is opened, and the silicon wafer W is loaded in the process chamber 1 with a wafer transfer mechanism (not shown), and is held on the support table 2. After that, the wafer transfer mechanism is retreated, and the gate valve 13 is closed. Then, the support table 2 is moved upward by the ball screw mechanism to the position shown in FIG. 1. The interior of the process chamber 1 is evacuated by the vacuum pump of the exhaust system 12, to reach a desired vacuum degree.

The process gas is introduced from the process gas supply system 23 into the chamber 1 at a predetermined flow rate to set the gas pressure in the chamber 1 to 13 Pa to 1,333 Pa (100 mTorr to 10 Torr).

In this gas atmosphere, predetermined RF power is supplied to the support table 2 by the RF power supply 15. At this time, the DC power supply 16 applies a predetermined voltage to the electrode 6a of the electrostatic chuck 6, so that the silicon wafer W is attracted and held by the electrostatic chuck 6 with, e.g., the Coulomb force. Upon application of the RF power, an RF electric field is formed between the shower head 20 as the upper electrode and the support table 2 as the lower electrode. As described above, the horizontal field B is formed between the shower head 20 and support table 2 by the dipole ring magnet 24. Hence, orthogonal electromagnetic fields are formed in the process space between the electrodes where the silicon wafer W is present. The drift of electrons caused by the orthogonal electromagnetic fields causes magnetron discharge. A plasma caused by the magnetron discharge etches the silicon wafer W.

In this case, the gas pressure in the chamber 1 is set to as high as 13 Pa to 1,333 Pa (100 mTorr to 10 Torr). Thus, not only ions and charged particles of electrons but also a sufficient amount of radicals can be generated. The radicals act effectively to realize high-rate silicon etching at 20 μm/min or more, which cannot be conventionally achieved. The preferable range of the gas pressure is 26 Pa to 133 Pa (200 mTorr to 1 Torr). The upper limit of the pressure is determined by considering the planar uniformity of the object to be processed obtained by etching when the etching apparatus with the arrangement described above is used. If the gas pressure is excessively high during etching, the planar uniformity is degraded. Hence, the above value is set as the upper limit of the pressure. If a desired planar uniformity can be obtained, an upper limit of the gas pressure that matches the processing apparatus may be set.

Matters that are confirmed by actually performing silicon etching described above will be described.

In this case, an actual etching process is performed by using the etching apparatus shown in FIG. 1. First, a gas mixture of $SF_6$ gas and $O_2$ gas was used as the etching gas. The frequency of the RF power to be applied to the support table 2 was set at 40 MHz. A magnetic field of 17,000 μT (170 G) was formed for the process space by the dipole ring magnet. Etching was performed while changing the pressure in the chamber 1 and the RF power. The etching rate characteristics as shown in FIG. 4 were obtained. In FIG. 4, the abscissa represents the pressure in the chamber, and the ordinate represents the RF power.

As shown in FIG. 4, regardless of the value of the RF power, as the pressure in the chamber becomes higher than 13 Pa (100 mTorr), the etching rate increases.

The extinction rate of the radicals should be decreased so that the number of radicals above the silicon wafer W is increased. From this viewpoint, the distance between the plasma generation region and the silicon wafer W is preferably 20 mm or less.

In this embodiment, an RIE type plasma generation mechanism formed of parallel opposite electrodes is used. Thus, a plasma generation region is formed within 20 mm from the surface of the silicon wafer W. In other words, a region with a high plasma density can be generated on the side of the susceptor (lower electrode) where the silicon wafer W is set. That is, a region with a high plasma density can be generated immediately above the silicon wafer W.

Therefore, the number of radicals above the silicon wafer W can be increased by decreasing the extinction rate of the radicals. Also, the radicals can be caused to contribute to etching of the silicon wafer W effectively.

Etching is performed while forming a magnetic field perpendicular to the electric field between the electrodes. Hence, E×B drift occurs immediately above the silicon wafer W, so that a high plasma density is realized. In addition to the high gas pressure described above, this allows etching at an even higher rate.

When causing an etching reaction by using the radicals, a number $n_G$ of radicals contributing to the etching reaction on the object to be processed can be expressed as $n_G=n_o \cdot G_G - L_G$ where $n_o$ is the density of the mother gas (proportional to the pressure), $G_G$ is the rate at which the radicals are generated, and $L_G$ is the rate at which the radicals that extinguish by reactions other than the etching reaction extinguish. To increase the number $n_G$ of radicals contributing to the etching reaction on the object to be processed, $n_o \cdot G_G$ may be increased, that is, the gas pressure in the process chamber may be increased, as described above. Other than that, it is also effective to decrease $L_G$. To decrease $L_G$, the time until the reaction must be shortened as much as possible. For this purpose, the distance between the plasma generation region in the process chamber and the etching surface of the object to be processed is preferably 20 mm or less.

As the etching gas, a gas that is used as a general etching gas may be utilized. From the viewpoint of etching the silicon wafer W at a high rate, a fluorine compound gas having a high reactivity is preferably used. This will be described in detail. The following various types of gases can be utilized. Any one of these gases may be used alone, or a plurality of gases among these gases may be used in mixture.

(1) A saturated carbon fluoride compound gas expressed by $C_xF_y$ (y=2x+2) such as:

$CF_4$, $C_2F_6$, $C_3F_8$, $C_4F_{10}$, $C_5F_{12}$, $C_6F_{14}$, $C_7F_{16}$, $C_8F_{18}$, $C_{10}F_{22}$, or the like (2) An unsaturated carbon fluoride compound gas having one or more double bonds or triple bonds expressed by .$C_xF_y$ (y<2x+2) such as:

$C_2F_4$, $C_2F_2$, $C_3F_6$, $C_3F_4$, $C_4F_8$, $C_4F_6$, $C_4F_4$, $C_4F_2$, $C_5F_{10}$, $C_5F_8$, $C_5F_6$, $C_5F_4$, $C_6F_{12}$, $C_6F_{10}$, $C_6F_8$, $C_6F_6$, or the like (3) A carbon fluoride compound gas expressed by $C_xH_yF_z$ such as:

a compound gas, e.g., $CHF_3$, $CH_2F_2$, or $CH_3F$, in which at least one F of a gas of (1) or (2) is replaced by H (4) A carbon oxide fluoride compound gas expressed by $C_xF_yO_z$ (y=2x+2−2z) such as:

$C_2H_4O$, $C_3F_6O$, $C_3F_4O_2$, $C_4F_8O$, $C_4F_6O_2$, or the like (5) A fluorine compound gas (and fluorine gas) not containing carbon such as:

$F_2$, HF, $NF_3$, $SF_6$, $SiF_4$, or the like

As the fluorine compound gas, the larger the number of Fs in one molecule, the higher the reactivity. When such molecule is expressed as $A_xF_y$ (where A is an arbitrary element, and x and y are the valences), y may be 4 or more, and more preferably 6 or more because a higher reactivity can be obtained. For example, as a gas with y being 6 or more, $C_3F_8$, $SF_6$, and $S_2F_{10}$ can be exemplified. As a gas with y being 4 or more, $CF_4$ can be exemplified.

As a gas to be added to such fluoride compound gas, one of the following gases can be used.

(6) A halogen compound gas (and halogen gas) other than fluoride such as:

$Cl_2$, $Br_2$, $I_2$, HCl, HBr, HI, or the like (7) Other gases such as:

$H_2$, $N_2$, $O_2$, CO, or the like (8) Inert gas such as:

Ar, He, or the like

When oxygen gas is contained in the fluorine compound gas, the etching anisotropy can be enhanced, and the etching shape can be improved. More specifically, a gas containing $SF_6$ and $O_2$ at an $O_2/SF_6$ flow rate ratio of 0.1 to 0.5, and preferably 0.15 to 0.3, provides a high etching rate and good etching shape. When a gas containing $SF_6$ and $C_4F_8$ at a $C_4F_8/SF_6$ flow rate ratio of 0.3 to 0.6, and preferably 0.4 to 0.5, is used, a good effect can be obtained. Results obtained by performing etching to confirm this will be described.

The etching conditions are as follows.

| | |
|---|---|
| 1. Etching gas: | $SF_6 + O_2$ |
| (Condition A) Frequency of RF power: | 40 MHz |
| Mask: | $SiO_2$ |
| (Condition B) Frequency of RF power: | 27 NHz |
| Mask: | resist |
| 2. Etching gas: | $SF_6 + C_4F_8$ |
| Frequency of RF power: | 40 MHz |
| Mask: | $SiO_2$ |

Figure 5:
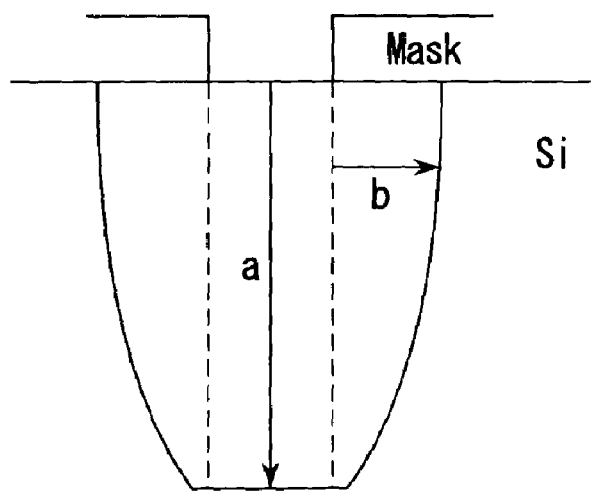
FIG. 5 is a view for explaining the vertical etching rate and side etching rate in etching.

Under the above etching conditions, etching was performed while changing the flow rate ratio of $O_2/SF_6$. A vertical etching rate a and side etching rate b shown in FIG. 5 are measured from the shape obtained by etching the silicon wafer under the condition A. The high-rate etching performance is evaluated using the vertical etching rate a. Also, the shape was evaluated using a ratio (etching rate ratio) b/a of the side etching rate b to the vertical etching rate a.

Figure 6:
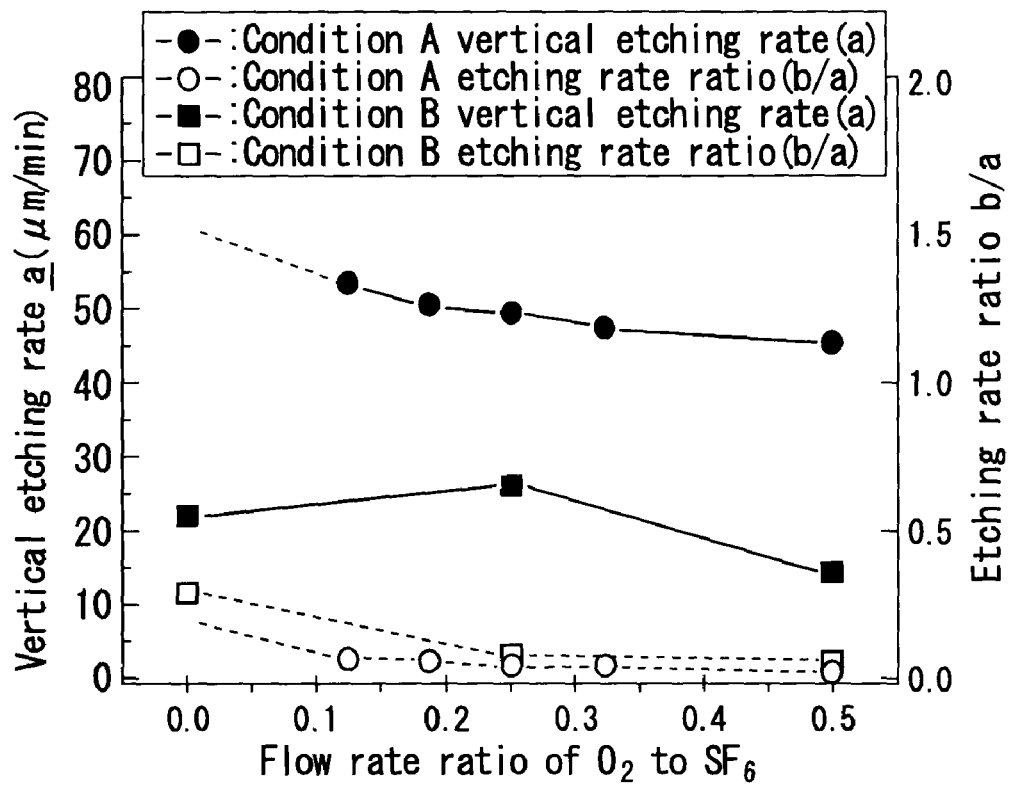
FIG. 6 is a graph showing the relationship between the flow rate ratio of $O_2/SF_6$ which forms an etching gas, the vertical etching rate, and the etching rate ratio.
Figure 7:
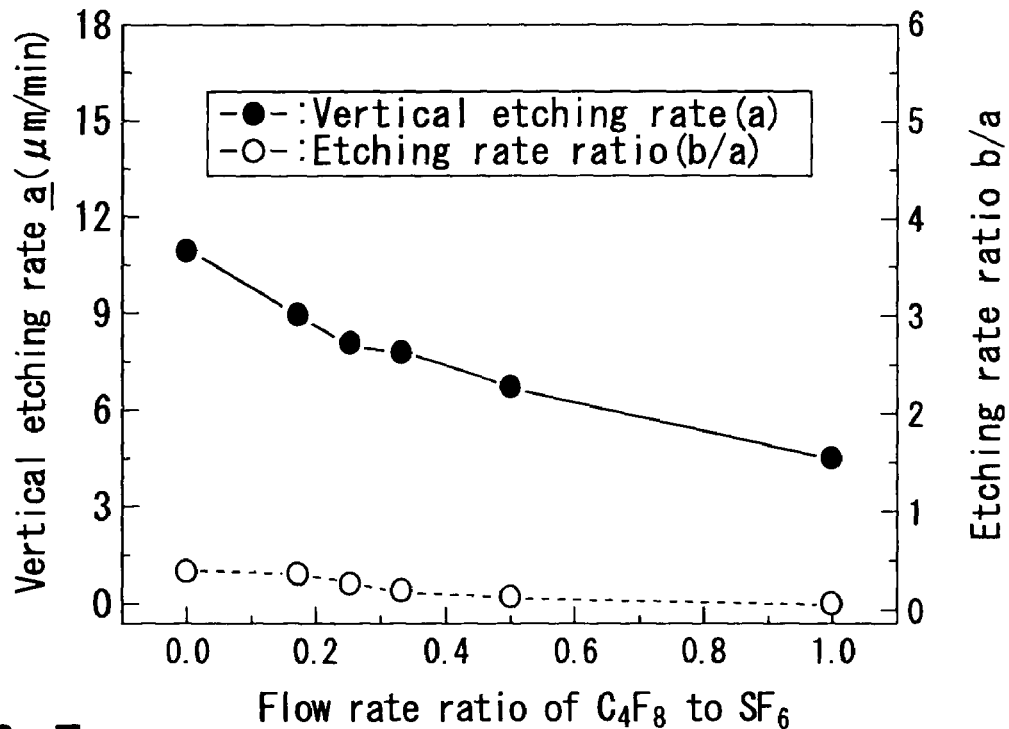
FIG. 7 is a graph showing the relationship between the vertical etching rate and etching rate ratio as a function of the flow rate ratio of the etching gas $C_4F_8/SF_6$.

FIGS. 6 and 7 show the results.

FIG. 6 is a graph showing the relationship between the vertical etching rate a and side etching rate b as a function of the flow rate ratio $O_2/SF_6$. FIG. 7 is a graph showing the relationship between the vertical etching rate a and etching rate ratio b/a as a function of the flow rate ratio $C_4F_8/SF_6$.

From FIG. 6, the high-rate etching performance and shape are good when the value of the flow rate ratio $O_2/SF_6$ is in the range of 0.1 to 0.5. In particular, in the range of 0.15 to 0.3, the vertical etching rate a and the etching rate ratio b/a balance well. Hence, this range is more preferable. From FIG. 7, the high-rate etching performance and shape are good when the flow rate ratio $C_4F_8/SF_6$ is in the range of 0.3 to 0.6. In particular, in the range of 0.4 to 0.5, the vertical etching rate a and the etching rate ratio b/a balance well. Hence, this range is more preferable.

To improve the etching shape, it is also effective to decrease the temperature of the silicon wafer W. In view of this, the refrigerant of the refrigerant area 17 is circulated as described above to generate cold heat. The process surface of the silicon wafer W can be decreased to a desired temperature with this cold heat through the support table 2. For example, when a refrigerant at a temperature of about −30° C. is circulated, the etching shape, i.e., the anisotropy, is improved. In order that the cold heat is transferred to the silicon wafer W easily, the gas inlet system 18 supplies a heat transfer gas to the space between the lower surface of the silicon wafer W and the upper surface of the electrostatic chuck 6. As the heat transfer gas, in place of ordinary helium (He), a process gas, e.g., $SF_6$ or $C_4F_8$, which is used as the etching gas may be introduced. These processes provide a higher cooling efficiency than He, and can further enhance the effect of cooling the silicon wafer W.

The frequency and output of the first RF power supply 15 are appropriately set in order to form a desired plasma. From the viewpoint of increasing the plasma density immediately above the silicon wafer W, the frequency is preferably 27 MHz or more.

Matters that are confirmed by actually performing silicon etching with this frequency will be described.

The etching apparatus shown in FIG. 1 was used. $C_4F_8 + SF_6$ was used as the etching gas. The silicon wafer W was etched while changing the frequency of the RF power. The etching rate and the etching selectivity with respect to the resist were obtained.

Figure 8:
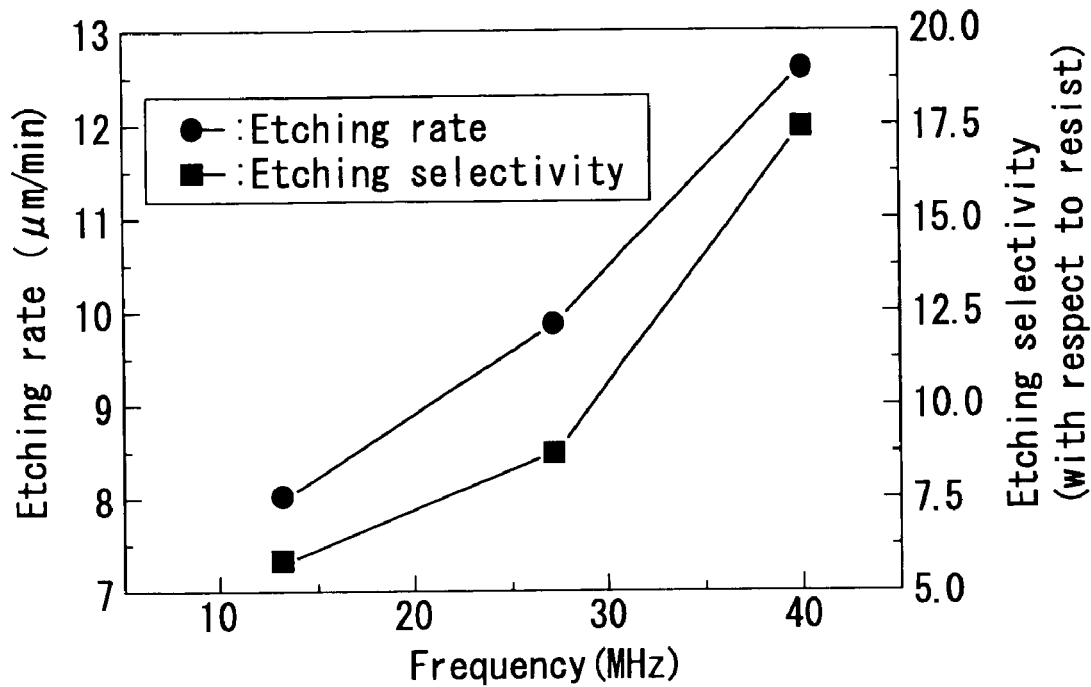
FIG. 8 is a graph showing the relationship between the frequency of the RF power, the etching rate, and the etching selectivity.

FIG. 8 shows the relationship among the frequency of the RF power, the etching rate, and the etching selectivity. The frequency is plotted along the abscissa, and the etching rate and etching selectivity are plotted along the ordinate. As shown in FIG. 8, as the frequency increases, both the etching rate and etching selectivity tend to increase, particularly largely when the frequency is 27 MHz or more.

From the viewpoint of increasing the etching rate and etching selectivity, the frequency is preferably 40 MHz or more. However, the frequency is not limited to 40 MHz, and has no particular upper limit. In view of the issues (efficiency and the like) arising in the actual RF power transmitting method used in the etching apparatus of this embodiment, the practical range may be 40 MHz to 200 MHz.

FIG. 8 shows results for the frequency of only up to 40 MHz. Even when the frequency is 40 MHz or more, as the frequency increases, the etching rate and etching selectivity may increase. This can be understood easily.

The second RF power supply 26 supplies RF power for controlling the ion energy of the plasma. The frequency of the RF power supply 26 is lower than that of the first RF power supply 15, and is preferably 2 MHz or more.

The dipole ring magnet 24 applies a magnetic field to the process space between the support table 2 and shower head 20 serving as opposing electrodes. This is to increase the plasma density immediately above the silicon wafer W. In order that this effect is exhibited effectively, the dipole ring magnet 24 is preferably a strong magnet that forms a magnetic field of 10,000 μT (100 G) or more in the process space. The stronger the magnetic field, the higher the effect of increasing the plasma density may be. From the viewpoint of safety, the strength of the magnetic field is preferably 100,000 μT (1 kG) or less.

To etch the silicon wafer W at high rate, the opening ratio of etching, i.e., the proportion of the area of the etching holes to the total area of the silicon wafer W, must also be considered. When the opening ratio is excessively large, high-rate etching becomes difficult to perform. From this viewpoint, the opening ratio is preferably 10% or less, and more preferably 5% or less. The opening width of etching is not particularly limited, and can be about 5 μm or more, but preferably 10 μm or more. The opening width has no particular lower limit, but about 200 μm or less is preferable.

As described above, when the gas pressure in the chamber 1 during etching is increased and other conditions are regulated within preferable ranges, silicon etching can be performed at high rate. From the viewpoint of practicality, for example, the gas pressure in the chamber 1 is set to 26.6 Pa to 66.5 Pa (200 mTorr to 500 mTorr). The frequency of the first RF power supply 15 is set to 40 MHz. The frequency of the second RF power supply 26 is set to 32 MHz. The strength of the magnetic field in the process space formed by the dipole ring magnet 24 is set to 10,000 μT to 30,000 μT (100 G to 300 G). When these conditions are employed, the silicon wafer W can be etched at a very high rate of about 50 μm/min or more.

The result obtained by actually etching the silicon wafer W under these practical conditions will be described.

An $SiO_2$ mask was formed on the surface of the silicon wafer, and etching was performed using the etching apparatus shown in FIG. 1. The etching conditions were as follows. The pressure in the chamber 1 was set to 33.25 Pa (250 mTorr). As the etching gas, $SF_6$ and $O_2$ were supplied into the chamber 1 at flow rates of 0.4 L/min and 0.13 L/min, respectively. The frequency of the RF power output from the first RF power supply 15 was set to 40 MHz. The frequency of the RF power output from the second RF power supply 26 was set to 3.2 MHz. The strength of the magnetic field in the process space formed by the dipole ring magnet 24 was set to 17,000 μT (170 G) The output of the RF power from the first RF power supply 15 was set to 2,300 W. To cool the silicon wafer W efficiently, $SF_6$ gas was used as the gas to be supplied to the lower surface of the wafer, so that the temperature of the bottom surface of the silicon wafer W became −15° C. The opening diameter of holes to be formed by etching was set to 20 μm.

Figure 9:
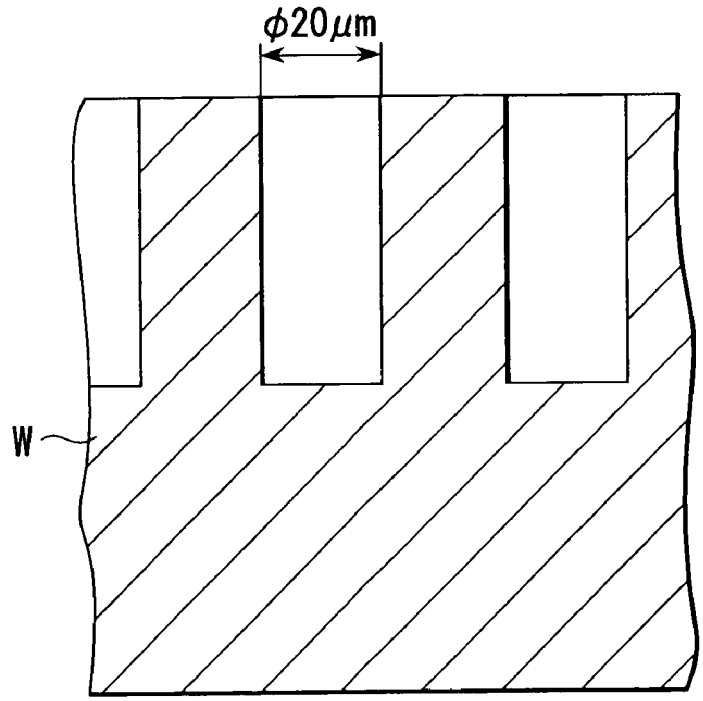
FIG. 9 is a view showing the shape of an example of through holes formed when etching is actually performed with the etching apparatus shown in FIG. 1.

FIG. 9 shows hole shapes obtained by this etching. FIG. 9 shows an image photographed by an electron micrograph in the form of a line drawing.

The etching rate of this etching was as very high as 49.3 μm/min. As shown in FIG. 9, the hole shapes were good. The etching selectivity of silicon to $SiO_2$ of the mask was 50.7.

When the pressure in the process chamber 1, the etching gas flow rate, the RF power, and the like are optimized, an etching rate of 60 μm/min or more can be obtained. This is also confirmed.

As described above, it was confirmed that when the method of this embodiment was employed, silicon was etched at a very high rate, and the etching shape became good.

With the high-rate etching method described above, holes and grooves extending through the silicon wafer can be formed. Alternatively, holes may be formed in the silicon wafer with the above high-rate etching method. After that, that surface of the silicon wafer which is opposite to the target etching surface may be entirely ground or etched by using a technique such as CMP. Then, the formed holes or grooves become through holes or the like extending through the silicon wafer.

The present invention is not limited to the above embodiment, but can be modified in various manners. For example, in the above embodiment, a dipole ring magnet was used as a magnetic field forming means for the magnetron RIE plasma etching apparatus. However, the present invention is not limited to this, and formation of the magnetic field is not necessary. As far as a plasma can be generated by a gas pressure falling within the range of the present invention, the arrangement of the etching apparatus is not particularly limited. Also, various types of plasma etching apparatuses such a capacitive coupling type apparatus or an induction coupling type apparatus can be used. From the viewpoint of generating a plasma under a high pressure, a capacitive coupling type apparatus is more preferable than an induction coupling type apparatus.

From the viewpoint of narrowing the plasma generation region and causing it to be in contact with the object to be processed, the RIE type apparatus is preferable among the various types of apparatuses. The above embodiment exemplifies etching of a silicon wafer. As far as silicon of an object to be processed including a silicon region is to be etched, the present invention is not limited to etching of a single-crystal silicon wafer.

As has been described above, according to the present invention, when the gas pressure in the process chamber during plasma generation is set to as high as 13 Pa to 1,333 Pa (100 mTorr to 10 Torr), a sufficient amount of radicals can be generated. When the etching rate is set to 20 μm/min or more and other conditions are optimized, high-rate silicon etching with an etching rate of 50 μm/min or more, which cannot be conventionally obtained, can be realized.

Therefore, the present invention can be suitably applied to formation of through holes in a three-dimensional device. Other than that, by utilizing the micromachining characteristics combined with this high-rate etching performance, chip dicing from a substrate, which was conventionally performed by machining, can be realized with a grinding margin of less than half that of conventional machining. In this manner, applications in micromachining, mask formation in electron beam lithography, and the like can be expected.

INDUSTRIAL APPLICABILITY

According to the high-rate silicon etching method of the present invention, in order to increase the silicon etching rate, the sum of the number of charged particles such as ions and the number of radicals must be large. To satisfy this, the gas pressure in the process chamber is increased, and radicals as neutral particles are caused to largely contribute to silicon etching. Thus, high-rate silicon etching is realized.

According to the high-rate silicon etching method of the present invention, when the gas pressure in the process chamber, more particularly in the process space for the object to be processed, during plasma generation is set to as high as 13 Pa to 1,333 Pa (100 mTorr to 10 Torr), a sufficient amount of radicals can be generated. When the etching rate is set to 20 μm/min or more and other conditions are optimized, higher-rate silicon etching with an etching rate of 50 μm/min or more, which cannot be conventionally obtained, can be realized.

The invention claimed is:

1. A high-rate silicon etching method wherein, by using a magnetron etching apparatus having a process chamber which can be held in vacuum, a pair of electrodes provided in the process chamber to sandwich a process space, RF power supply means for applying RF power of not less than 27 MHz for plasma generation to an electrode where an object to be processed is held, thereby forming an RF electric field in the process space, an etching gas inlet mechanism which introduces an etching gas containing a fluorine compound gas into the process space, thereby forming a gas atmosphere, and magnetic field forming means for forming in the process space a magnetic field perpendicular to the RF electric field and directed in one direction, when etching a silicon region at a high rate of not less than 20 μm/min such that orthogonal electromagnetic fields are formed in the process space to generate a plasma in the gas atmosphere, and an object to be processed is set such that the silicon region of an etching target surface of the object to be processed is in contact with the plasma, etching is performed by setting a gas pressure in the process space to 13 Pa to 1,333 Pa (100 mTorr to 10 Torr), and wherein a distance between a plasma generation region in the process space and an etching surface of the object to be processed is not more than 20 mm.

2. A high-rate silicon etching method according to claim 1, wherein
etching is performed by setting the gas pressure in the process space to 26 Pa to 133 Pa (200 mTorr to 1 Torr).

3. A high-rate silicon etching method according to claim 2, wherein
the magnetic field forming means has a dipole ring magnet in which a plurality of anisotropic segment magnets are arranged to form a ring shape around the process chamber and directions of magnetization of the anisotropic segment magnets are so set as to form a uniform unidirectional magnetic field between the electrodes.

4. A high-rate silicon etching method according to claim 1, wherein
the etching gas further contains oxygen.

5. A high-rate silicon etching method according to claim 1, wherein
the RF power supply applies RE power of 40 MHz to 200 MHz.

6. A high-rate silicon etching method according to claim 1, wherein
the magnetic field forming means forms a magnetic field of not less than 10,000 µT (100 G) in a region where the object to be processed is present.

7. A high-rate silicon etching method according to claim 1, wherein
the object to be processed having the silicon region is a single-crystal silicon substrate.

8. A high-rate silicon etching method according to claim 1, wherein
when a molecule of the fluorine compound gas is expressed as $A_xF_y$ (where A is an arbitrary element and x and y are valences), y is not less than 4.

9. A high-rate silicon etching method according to claim 8, wherein
y of the fluorine compound gas is not less than 6.

10. A high-rate silicon etching method wherein, by using a magnetron etching apparatus having
a process chamber which can be held in vacuum,
a pair of electrodes provided in the process chamber to sandwich a process space,
RF power supply means for applying RF power of not less than 27 MHz for plasma generation to an electrode where an object to be processed is held, thereby forming an RF electric field in the process space,
an etching gas inlet mechanism which introduces an etching gas containing a fluorine compound gas and oxygen into the process space, thereby forming a gas atmosphere, and
magnetic field forming means for forming in the process space a magnetic field perpendicular to the RF electric field and directed in one direction,
when etching a silicon region such that orthogonal electromagnetic fields are formed in the process space to generate a plasma in the gas atmosphere, and an object to be processed is set such that the silicon region of an etching target surface of the object to be processed is in contact with the plasma, etching is performed by setting a gas pressure in the process space to 13 Pa to 1,333 Pa (100 mTorr to 10 Torr), wherein
the etching gas contains $SF_6$ and $O_2$, and $O_2/SF_6$ is 0.1 to 0.5.

11. A high-rate silicon etching method wherein, by using a magnetron etching apparatus having
a process chamber which can be held in vacuum,
a pair of electrodes provided in the process chamber to sandwich a process space,
RF power supply means for applying RF power of not less than 27 MHz for plasma generation to an electrode where an object to be processed is held, thereby forming an RF electric field in the process space,
an etching gas inlet mechanism which introduces an etching gas containing a fluorine compound gas into the process space, thereby forming a gas atmosphere, and
magnetic field forming means for forming in the process space a magnetic field perpendicular to the RF electric field and directed in one direction,
when etching a silicon region such that orthogonal electromagnetic fields are formed in the process space to generate a plasma in the gas atmosphere, and an object to be processed is set such that the silicon region of an etching target surface of the object to be processed is in contact with the plasma, etching is performed by setting a gas pressure in the process space to 13 Pa to 1,333 Pa (100 mTorr to 10 Torr), wherein
the etching gas contains $SF_6$ and $C_4F_8$, and $C_4F_8/SF_6$ is 0.3 to 0.6.

12. A high-rate silicon etching method according to claim 11, wherein
the gas pressure in the process space is set to 26 Pa to 133 Pa (200 mTorr to 1 Torr).

13. A high-rate silicon etching method wherein, by using a magnetron etching apparatus having
a process chamber which can be held in vacuum,
a pair of electrodes provided in the process chamber to sandwich a process space, first RF power supply means for applying RF power for plasma generation to an electrode where an object to be processed is held, thereby forming an RF electric field in the process space,
an etching gas inlet mechanism which introduces an etching gas into the process space, thereby forming a gas atmosphere,
magnetic field forming means for forming in the process space a magnetic field perpendicular to the RF electric field and directed in one direction, and
a second RF power supply which applies RF power different in frequency from the RF power from the first RF power supply to an electrode where the object to be processed is held,
when etching a silicon region at a high rate such that orthogonal electromagnetic fields are formed in the process space to generate a plasma in the gas atmosphere, and an object to be processed is set such that the silicon region of an etching target surface of the object to be processed is in contact with the plasma, RF power which has a frequency lower than that of the RF power for plasma generation from the first RF power supply means and not less than 2 MHz and is output from the second power supply is superposed on the RF power for plasma generation, and etching is performed by setting a gas pressure in the process space to 13 Pa to 1,333 Pa (100 mTorr to 10 Torr).

14. A high-rate silicon etching method according to claim 13, wherein
the gas pressure in the process space is set to 26 Pa to 133 Pa (200 mTorr to 1 Torr).

15. A high-rate silicon etching method wherein, by using a magnetron etching apparatus having
a process chamber which can be held in vacuum,
a pair of electrodes provided in the process chamber to sandwich a process space,
RF power supply means for applying RF power of not less than 27 MHz for plasma generation to an electrode where an object to be processed is held, thereby forming an RF electric field in the process space,
an etching gas inlet mechanism which introduces an etching gas containing a fluorine compound gas into the process space, thereby forming a gas atmosphere, and
magnetic field forming means for forming in the process space a magnetic field perpendicular to the RF electric field and directed in one direction,
when etching a silicon region such that orthogonal electromagnetic fields are formed in the process space to generate a plasma in the gas atmosphere, and an object to be processed is set such that the silicon region of an etching target surface of the object to be processed is in contact with the plasma, etching is performed by setting a gas pressure in the process space to 13 Pa to 1,333 Pa (100 mTorr to 10 Torr),
wherein the object to be processed having the silicon region is a single-crystal silicon substrate, and
after the step of etching the single-crystal silicon substrate by the high-rate silicon etching method, an opposite surface of the silicon substrate is entirely ground or etched, so a hole or groove formed in the silicon substrate by the high-rate silicon etching method extends through the silicon substrate.

16. A high-rate silicon etching method according to claim 15, wherein
the gas pressure in the process space is set to 26 Pa to 133 Pa (200 mTorr to 1 Torr).

17. A high-rate silicon etching method of etching a silicon region in order to form a hole, groove, or through hole in a silicon substrate, wherein
in a process space where the silicon substrate is to be set and a plasma for etching is to be generated, RF power is applied to an electrode on which the silicon substrate is mounted, thereby generating the plasma, and the gas pressure in the process space is set to 13 Pa to 1,333 Pa (100 mTorr to 10 Torr),
a gas pressure of an etching gas containing a fluorine compound gas in the process space is so increased as to increase the number of radicals as neutral particles contributing to silicon etching and the number of charged ion particles, regardless of a plasma density in the process space, thereby setting an etching rate in the silicon region to be not less than 20 μm/min.

18. A high-rate silicon etching method according to claim 10, wherein
the gas pressure in the process space is set to 26 Pa to 133 Pa (200 mTorr to 1 Torr).

* * * * *

UNITED STATES PATENT AND TRADEMARK OFFICE
CERTIFICATE OF CORRECTION

| | |
|---|---|
| PATENT NO. | : 7,022,616 B2 |
| APPLICATION NO. | : 10/380428 |
| DATED | : April 4, 2006 |
| INVENTOR(S) | : Mimura et al. |

It is certified that error appears in the above-identified patent and that said Letters Patent is hereby corrected as shown below:

On the title page, Item (30), the Foreign Application Priority Data has been omitted.
Item (30) should read:

-- (30)    Foreign Application Priority Data

Sep. 14, 2000   (JP)………………………...2000-280376--

Signed and Sealed this

Eighteenth Day of July, 2006

JON W. DUDAS
*Director of the United States Patent and Trademark Office*